United States Patent [19]
Zurcher

[11] Patent Number: 4,939,749
[45] Date of Patent: Jul. 3, 1990

[54] DIFFERENTIAL ENCODER WITH SELF-ADAPTIVE PREDICTIVE FILTER AND A DECODER SUITABLE FOR USE IN CONNECTION WITH SUCH AN ENCODER

[75] Inventor: Frédéric Zurcher, Lannion, France

[73] Assignee: Etat Francais représenté par le Ministre des Postes Télécommunications et de l'Espace (Centre National d'Etudes des Télécommunications), Issy les Moulineaux, France

[21] Appl. No.: 322,952

[22] Filed: Mar. 14, 1989

[30] Foreign Application Priority Data

Mar. 14, 1988 [FR] France .................................. 88 03288

[51] Int. Cl.$^5$ .......................................... H04B 14/06
[52] U.S. Cl. ........................................ 375/30; 375/34; 341/143
[58] Field of Search ............... 375/27, 30, 33; 341/51, 341/76, 143; 371/43

[56] References Cited

U.S. PATENT DOCUMENTS

| | | | |
|---|---|---|---|
| 4,654,863 | 3/1987 | Belfield et al. ........................ | 375/27 |
| 4,691,233 | 9/1987 | Acampora ............................. | 375/27 |
| 4,797,902 | 1/1989 | Nishiguchi et al. .................. | 375/27 |

FOREIGN PATENT DOCUMENTS 2445660  7/1980  France .

Primary Examiner—Benedict V. Safourek
Attorney, Agent, or Firm—Fleit, Jacobson, Cohn, Price, Holman & Stern

[57] ABSTRACT

A differential encoder for speech encoding, typically in a 16 kHz wide band, has a self adaptive predictive filter, comprising a comparator receiving, on an additive input, successive samples of a signal to be encoded and, on a subtractive input, an estimated signal delivered by a prediction loop which receives the error signal from the output of the comparator, the prediction loop comprising a self-adaptive predictive filter, a gain control circuit and a multiplier which receives the outputs of the predictive filter and of the gain control circuit and whose output is connected to the subtractive input. The predictive filter comprises a plurality of parallel channels assigned to different mutually adjacent spectral bands, each channel comprising an input pass-band filter, a quadratic detector fed by the pass-band filter, and a peak detector whose input is connected to the quadratic detector and whose output is applied to a multiplier which also receives the output signal from the respective pass-band filter, the outputs of all multipliers driving a common summer. A decoder for recovering the speech has a symmetric construction.

11 Claims, 6 Drawing Sheets

DIFFERENTIAL ENCODER WITH SELF-ADAPTIVE PREDICTIVE FILTER AND A DECODER SUITABLE FOR USE IN CONNECTION WITH SUCH AN ENCODER

BACKGROUND OF THE INVENTION

1. Technical Field

The invention relates to differential encoders with self-adaptive predictive filter and it is particularly, although not exclusively, suitable for use in the telephone field where it is desirable to have both good speech reproduction quality for the lowest possible in-line bit rate (for example 16 kbits/s) and a high resistance to transmission errors.

2. Prior Art different encoders are already known which operate at the above bit rate, particularly vocoders with impulse energization and sub-band encoders. These encoders are complex. In addition, they introduce delays of several tens of milliseconds. An ADPCM encoder is also known (FR-A-2,445,660) having a predictive filter and an analyzing filter, consequently complex in construction.

SUMMARY OF THE INVENTION

It is an object of the invention to provide a differential encoder providing a speech quality at least comparable to those of the prior art, having a much less implementation complexity.

The invention consequently relates to a differential encoder with a self-adaptive predictive filter of the type comprising a comparator receiving, on an additive input, the signal to be encoded and, on a substractive input, an estimated signal delivered by a prediction loop which receives the error signal from the output of the comparator, the prediction loop comparising the self-adaptive predictive filter, an automatic gain control circuit and a multiplier which receives the outputs of the predictive filter and of the gain control circuit and whose output is connected to the substractive input.

Present time encoders of the above-defined type do not allow decoded speech to be obtained of reasonable telephonic quality at a bit rate of about 16 kbit/s and are therefore less satisfactory. A purpose of the invention is in particular to provide an improved self-adaptive differential encoder, particularly an encoder with has a quality very much higher without appreciably increased complexity.

To this end, the invention provides an encoder whose predictive filter comprises a plurality of parallel channels assigned to different and adjacent spectral bands, each channel comprising an input pass-band filter which feeds a quadratic detector followed by a peak detector whose output is applied to a multiplier which also receives an output signal from the respective pass-band filter, the outputs of all multipliers driving a same summer.

In that encoder, the connection of the predictive filter is such that it also operates as an analyzing filter, which considerably reduces the complexity. Since the input signal has constant energy (i.e. is not affected by the gain), there is not accuracy variation in the computation.

The predicitive filter makes it possible to enhance the spectral dynamic range in the zones where it is necessary, by an appropriate choice of the width of the adjacent band filters.

Such a time-related encoder makes it possible to obtain good telephonic quality for speech with an output bit rate of 16 kbit/s. In a particularly avantageous embodiment of the invention, the encoder is of a type delivering one output bit per sample. In this configuration, it appears, as seen from the outside, as a $\Delta$ encoder since the in-line transmitted code is formed solely by the prediction error sign, sample by sample. The complexity of the encoder is minimum. Another advantage is that the in-line transmitted digital signals do not have to be distributed in frames and no synchronization is therefore required. The encoder with one single bit per sample only introduces a negligible time delay, less than 300 $\mu$s in the case of 16 kbit/s transmission. Finally, the one bit per sample encoder is very resistant to transmission errors.

The invention will be better understood from a reading of the following description of particular embodiments, given by way of non-limitative examples.

DETAILED DESCRIPTION OF PREFERRED EMBODIMENTS

Encoder and decoder with one in-line bit per sample

Figure 1:
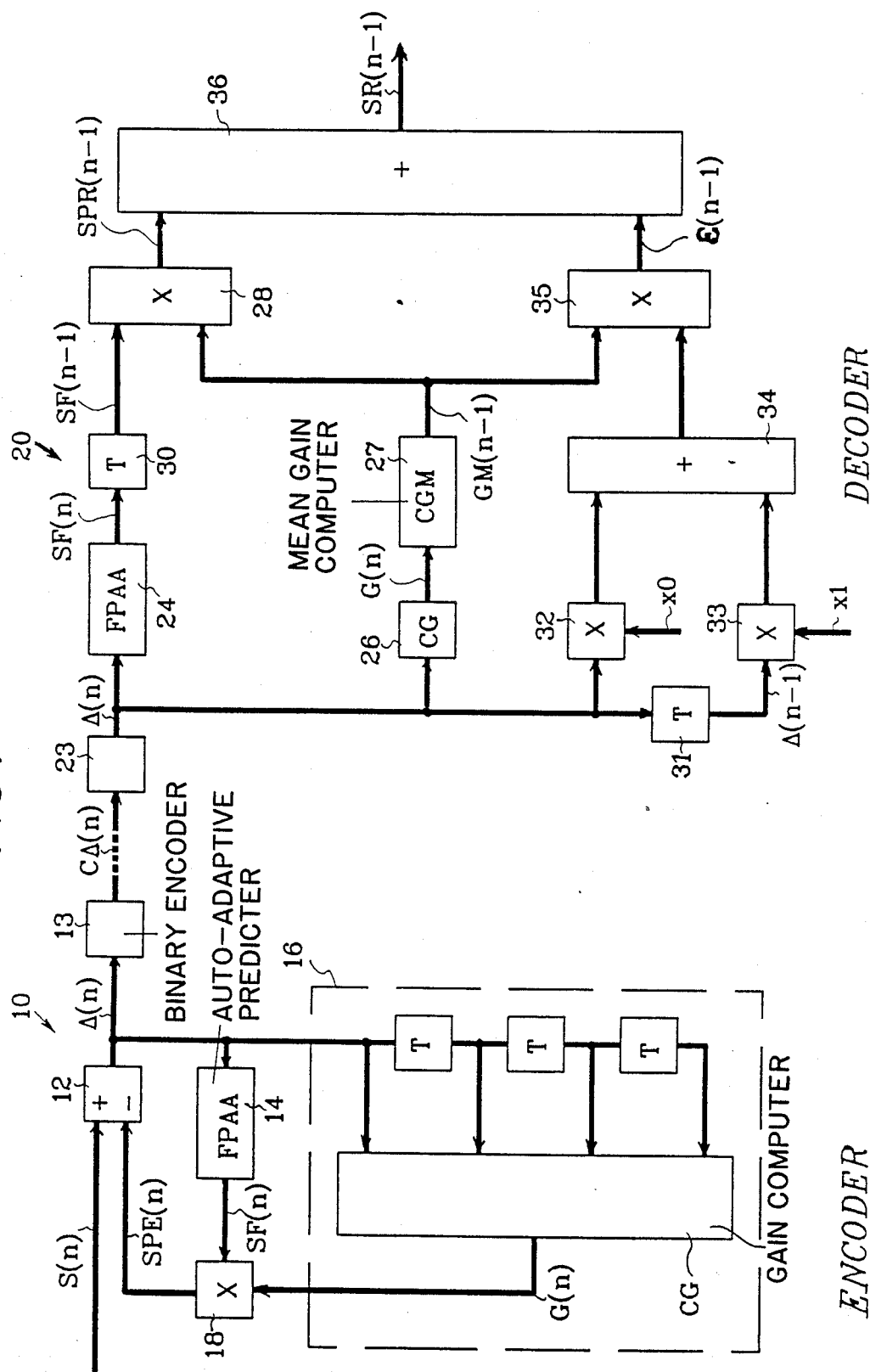
FIG. 1 is a simplified block diagram showing a possible constructin of an encoder delivering one bit per sample and a decoder associated thereto, in a first embodiment of the invention.

The encoder 10 shown in FIG. 1 is provided for delivering, as output signal, a sequence of binary codes $C\Delta(n)$ each representing the sign of an error $\Delta(n)$ which may have two values $+\Delta$ et $-\Delta$ for each samples $S(n)$ of order n.

The encoder comprises a comparator 12 whose output may have the values $+\Delta$ et $-\Delta$ depending on the sign of the difference between the digital sample $S(n)$ of the signal to be encoded, applied to one of its inputs, and a corresponding transmission predicted sample $SPE(n)$ applied to the other input.

An output circuit 13 of the encoder transforms the sequence of error signals $\Delta(n)$ into a sequence of 0s and 1s fed over the transmission line to a decoder and constituting the codes $C\Delta(n)$.

The circuit for generating the predicted sample $SPE(n)$ comprises (contrary to the now usual $\Delta$ encoders which are are provided with a fixed predictive filter, which does not allow them to restore an acceptable telephonic quality at bit rates less than 32 kbits/s): a self-adaptive predictive filter 14 (designated hereafter by the abbreviation FPAA) for analysing the error signal $\Delta(n)$ which can only assume two mutually opposite values, and for restoring it with a reinforced spectral dynamic range; a unit 16 for computing the gain CG; and a multiplier 18 which multiplies the constant level output SF(n) of the FPAA 14 by the gain G(n) so as to deliver the predicted transmission sample SPE(n) at any time.

The construction of decoder 20 is to a large extend symmetrical with that of encoder 10. The input circuit 23 transforms the binary values 1 et 0 arriving over the transmission line into successive samples $\Delta(n)$ which may assume two values of the same level, but of opposite polarities. The signal $\Delta(n)$ drives an FPAA 24 identical to FPAA 14 of encoder 10 and a gain computing unit 26 identical to unit 16 for calculating the gain CG. The unit 27 for calculating the smoothered average gain delivers, from the gains G(n), G(n−1) and G(n−2), a mean gain GM(n−1) used at sampling time (n−1) and equal to $\alpha 5$ G(n)+$\alpha 6$ G(n−1)+$\alpha 7$ G(n−2) with $\alpha 5 + \alpha 6 + \alpha 7 = 1$ (each of the three coefficients may typically be equal to ⅓). A multiplier 28 receives at one input the gain at reception GM(n−1) delivered by unit 27 and at the other the filtered signal SF(n−1) coming from the output of the FPAA 24, through a time delay element 30 having a transit time equal to the time interval T between two successive samples.

An adder 36 receives the predicted reception signal SPR(n−1) delivered by multiplier 28, when the code $\Delta(n)$ arrives; in the embodiment shown in FIG. 1, it also receives at the same time a magnitude comparable to the prediction error signal $\epsilon(n-1)$ which is the sum, weighted by coefficients x0 and x1, of values $\Delta(n)$ and $\Delta(n-1)$, computed from the signal $\Delta(n)$ by means of the delay element 31, multiplers 32 and 33 and adder 34, and multiplied by the gain GM(n−1) in the multiplier 35.

The re-constructed signal SR(n−1), corresponding to the input signal S(n−1) applied to the encoder, appears at the output of adder 36.

There will now be described successively a structure of FPAA 14 or 24 which can be used in the device of FIG. 1 for implementing the invention, then a structure of CG.

Self-adaptive predictive filter

The predictive filter 14 shown in FIG. 1 comprises I parallel channels, designated by the indices 1, 2, ..., i, ..., I which drive the same adder 39, whose output constitutes the signal SF(n). The samples $\Delta(n)$ are applied to all channels.

In the case of a predictive filter 14 for a differential telephone encoder, ten channels are sufficient to give quite satisfactory results; the filters used in this case have a width which is minimum in the most significant portion of the speech spectrum, about 250 to 400 Hz, and a progressively increasing width for the higher frequencies. A higher number of channels is advantageous to the extent that it is accepted to implement the FPAA by means of a high speed signal processor.

It is desirable that the pass-bands of the −3 db filters partially overlap mutually to reduce the ripple of the total response SF(n) delivered by the adder 39.

Each channel comprises an input band-pass filter 37, which may be formed as a simple second order resonator.

Different response laws may be adopted for the filters 37. Responses may for example be adopted which have the form:

$$SFi(n) = a0_i \cdot \Delta(n) + a1_i \cdot \Delta(n-1) + b1_i \cdot SFi(n-1) + b2_i \cdot SFi(n-2)$$

in which $a0_i$, $a1_i$, $b1_i$ and $b2_i$ are coefficients, which are different depending on the order i of the band-pass filter. The filters 37 correspond to frequency ranges centered on increasing values F1, F2, ..., Fi, ..., FI. The coefficients b1 and b2 determine the central frequency and the width of the pass-bands. The gains of the filters are proportional to the coefficients a0 and a1. Their amount symmetry is determined by the ratio a0/a1. The coefficients $a0_i$ and $a1_i$ are adjusted to minimise the distorsion of SFi for sine-shaped input signals (of the encoder) having frequencies corresponding to the different central frequencies F1, ..., FI of the filters.

The output of each filter, for example output SFi(n) for the frequency range centered on Fi, is applied to a quadratic detector 38, which may be a multiplier. The detected signal obtained, $(SFi_{(n)})^2$ for the frequency range centered on frequency Fi, is applied to a subtractor 40 whose subtractive input receives a predetermined and constant value Vi. The vlaues V1, V2, ..., VI are independent and adjusted depending of the rank of the filter.

The output signal of each subtractor 40, for example $[(SFi_{(n)})^2 - Vi]$, drives a peak detector 42 which provides a function for smoothing of the spectral evolution. This result may be reached using a detector 42 whose operation is defined by the relations:

if $SCi_n < ((SFi_{(n)})^2 - Vi)$, then $SCi_n$ is adjusted at the level $SCi_{(n-1)} + di((SFi_{(n)})^2 - Vi)$;

if $SCi_{(n)} \geqq ((SFi_{(n)})^2 - Vi)$ for more than Mi samples, then $SCi_{(n)}$ is adjusted at level $ci \cdot (SCi_{(n-1)})$;

if $SCi_{(n)} \geqq ((SFi_{(n)})^2 - Vi)$ for less than Mi samples, than $SCi_{(n)}$ is kept at level $SCi_{(n-1)}$.

ci and di are coefficients smaller than 1. The number Mi is an integer greater than 1 and is chosen experimentally as a function of the desired characteristics. Good results will often be obtained with values of Mi which increase with the order i and are of from 50 to 160. Mi and the constant coefficients di and ci may be different for the different channels.

Each channel further comprises a multiplier 44. In channel i, the multiplier receives the filtered signal $SFi_{(n)}$ on an input and the output signal $SCi_{(n)}$ of the peak detector 42i on the other input. All products obtained are applied to the adder 39 which therefor delivers at its output a filtered signal:

$$SF(n) = \sum_{i=1}^{I} SFi_{(n)} \times SCi_{(n)}$$

Even if the constant coefficients V1, ..., Vi are disregarded, it can be seen that the peak values of the signals $SFi_{(n)} \times SCi_{(n)}$ are very much enhanced, for they are proportional to the third power of the peak values of the corresponding signals $SFi_{(n)}$. The signal $SFE_{(n)}$ obtained therefore has a spectral dynamic range which is greatly reinforced with respect to that of signal $\Delta$, i.e., the maxima are increased whereas the minima are decreased. Since the FPAA 14 is placed in a feed-back loop (FIG. 1), the reinforcement tends to "wash" the output signal $\Delta(n)$, i.e. to flatten the spectrum of the error signal. The subtraction of the constant values Vi from the signals $(SFi_{(n)})^2$ further reinforces this effect.

The values Vi will be selected experimentally. However, as a general rule, the values of Vi will be all the higher the frequency band to which the filter corresponds. It is necessary to increase the predictability of the higher frequencies, which, due to their nature, is not as good as that of the lower frequencies.

To show the effect of the constants Vi, an example may be given. If it is assumed that $SF1_{(n)}$ and $SF2_{(n)}$ have respective peak values equal to 4 and 3, and if values V1=V2=4 are selected, the peak values $SC1_{(n)}$ and $SC2_{(n)}$ are 12 and 5, respectively, and the values become:

48 for $SC1_{(n)}.SF1_{(n)}$ 15 for $SC2_{(n)}.SF2_{(n)}$

On the other hand, if V1=V2=0, it is found that the factors $SC_{(n)}.SF_{(n)}$ are 64 and 27. It can be seen that the spectral dynamic range is very much reinforced since it is changed from 64/27=2,38 to 48/15=3,2.

All processing steps by the encoder (and by the decoder) may be performed using a signal processor.

Unit for computing the transmission gain G(n)

A function of the CG 16 is to continuously adapt the gain to the level of the signals S(n). In association with the CG 26, it must further allow fast realignment of the decoder in the case of a transmission error.

The CG 16 uses an adaptation algorithm responsive to the sequence of values Δ(n) successively available at its input. Different adaptation strategies may be adopted. One approach which has given good results consists in using the following criteria:

if four identical values appear at the output by the comparator 12, i.e. if:

$$\Delta(n)=\Delta(n-1)=\Delta(n-2)=\Delta(n-3)$$

the gain GE is "greatly" increased, for example by multiplying it by a factor $\alpha 1$ greater than 1:

$$G(n)=\alpha 1.G(n-1);$$

if there are only three identical values which follow each other, i.e. if:

$$\Delta(n)=\Delta(n-1)=\Delta(n-2)\neq \Delta(n-3)$$

the gain G(n) is "slightly" increased, for example by multiplying it by a factor $\alpha 2$ greater than 1 but less than $\alpha 1$:

$$G(n)=\alpha 2.G(n-1);$$

if three successive alternations occur, i.e. if:

$$\Delta(n)\neq \Delta(n-1)\neq \Delta(n-2)\neq \Delta(n-3),$$

the gain G(n)est "greatly" decreased, for example by multiplying it by a coefficient $\alpha 3$ lesser than 1;

finally, in all the other cases, G(n) is "slightly" decreased, for example by multiplying it by $\alpha 4$, with $\alpha 3 < \alpha 4 < 1$.

Other strategies are possible. The one which has just been defined requires elements providing a time delay T, shown schematically in FIG. 1.

For fast realignment at reception in the case of a transmission error, it may be useful to give to $\alpha 3$ a value equal to a predetermined constant value from which a term k.G(n−1) proportional to G(n−1), where k is a constant is subtracted. Thus, coefficient $\alpha 3$ is all the smaller the greater G(n−1). If, following a transmission error, the gain becomes higher at reception that at transmission, it will decrease more rapidly at transmission and realignment will take place more rapidly.

The decoder 20 is arranged for taking into account characteristics which are peculiar to the signal delivered by encoder 10. Whereas, in a conventional differential decoder, the re-constructed signal SR(n) is obtained by simply adding the quantified error signal Δ(n), recovered from the code CΔ(n) received over the line and the predicted signal at reception SPR(n), experience has shown that the quality of the re-constructed signal is improved by adding, to the predicted signal SPR(n−1) corresponding to the transmitted code CΔ(n−1), the sum of a fraction of the signal Δ(n−1) and a fraction of signal Δ(n).

Consequently, the decoder 20 shown in FIG. 1 comprises—in addition to the conventional prediction loop (which comprises the FPAA 24, the CG 26, the CGM 27 and the multiplier 28)—an additional channel whose output is applied, at the same time as that of multiplier 28, to the adder 36.

The additional channel comprises the multiplier 32 which receives Δ(n) and multiplies it by a coefficient x0 lesser than 1, the multiplier 33 which provides the product of Δ(n−1), obtained by means of a delay element 31, and of a factor x1, the adder 34 which provides the sum (x0.Δ(n))+(x1.Δ(n−1)) and the multiplier 35 which multiplies the result by the gain GM(n−1) re-constructed at reception and averaged.

The FPAA 24 is identical to the transmission FPAA 14. On the other hand, the CG 26 is completed by the CGM 27 which may be wired or programmed so as to introduce the constants $\alpha 5$, $\alpha 6$ and $\alpha 7$ and to deliver the re-constructed gain GM(n−1) obtained by the formula:

$$GM(n-1)=\alpha 7.G(n-2)+\alpha 6.G(n-1)+\alpha 5.G(n)$$

the coefficients $\alpha$ being so selected that $$\alpha 5+\alpha 6+\alpha 7=1$$

These coefficients determine the smoothing function: it is for example possible to use $\alpha 5=\alpha 7=0,25$ and $\alpha 6=0,5$.

Encoder with several output bits per sample

Figure 3:
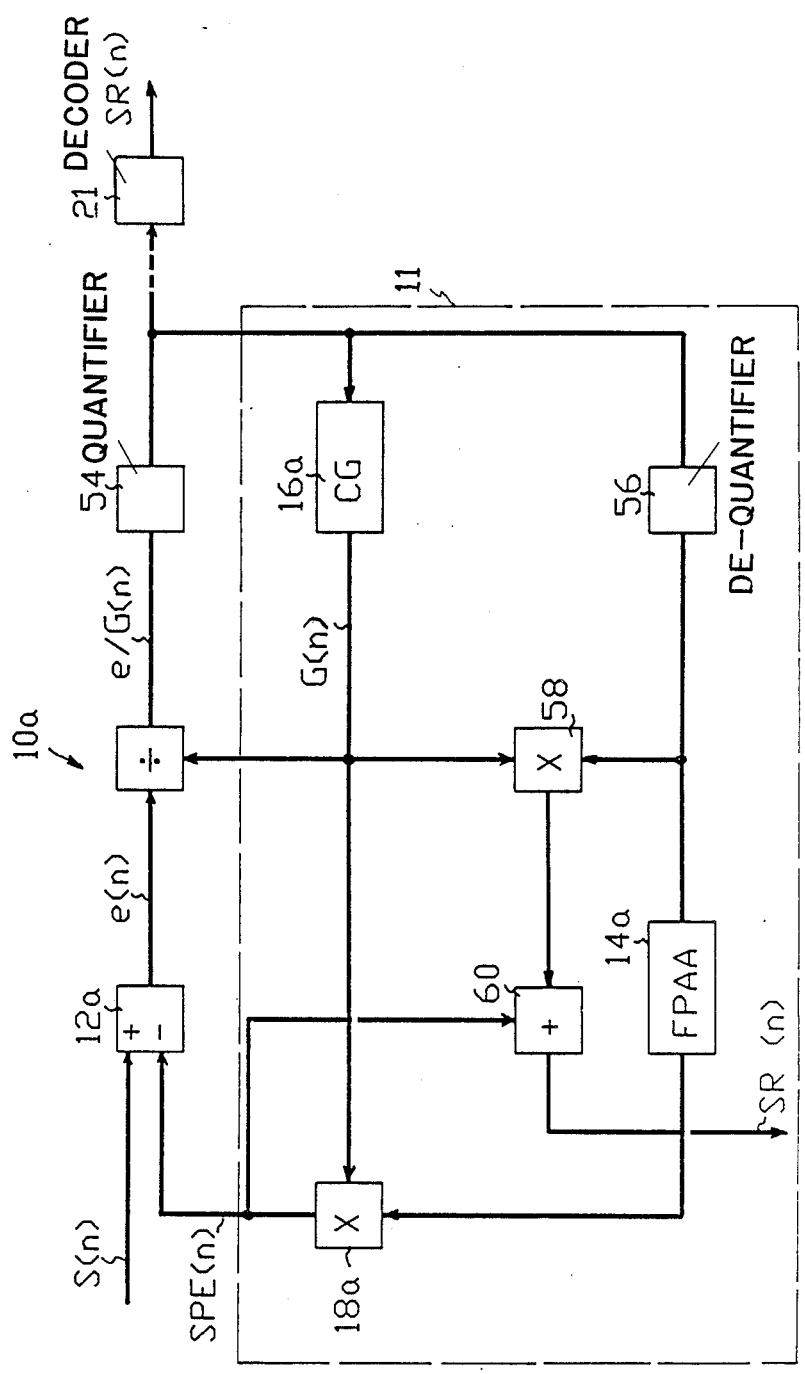
FIG. 3 is a block diagram showing a modified construction of the encoder, with several bits per sample, and the associated decoder.

The transmission encoder 10a shown schematically in FIG. 3 differs from that of FIG. 1 in that it delivers output symbols Δ having several bits per input sample S(n).

The predicted signal SPE(n) is then substracted from the input signal S(n) in a subtractor 12a and delivers an error signal e(n) which may have several levels. The error signal e(n) is divided by the gain G(n), delivered conventionally by the gain computing unit 16a responsive to the successive levels delivered by a quantifier 54 which quantifies the result of the division of e(n) by G(n).

The quantified signal is fed over the transmission line to the decoder of a remote receiver and fed to a local decoder 11 identical to the remote decoder 21. The local decoder comprises a reverse quantifier 56 driving the FPAA 14a. The output of the FPAA 14a is applied to a multiplier 18a which also receives the output of the transmission gain computing unit 16a for delivering the predicted signal SPE(n).

The signal e(n)/G(n), re-constructed by quantification at 54 and then de-quantification at 56, is multiplied by the gain G(n) in a multiplier 58, then added to SPE(n) at 60 to obtain the re-constructed transmission signal SR(n). The FPAA 14a may have a construction similar to that described above for a one-bit per sample encoder.

Although the encoders as described have a particular advantage in the case of a sampling frequency of 16 kHz with one bit per sample for application to telephone, it is not limited to this particular case. The encoder of FIG. 3 may in particular operate at different sampling frequencies, for example 8 kHz, 16 kHz, etc. and at different bit rates, for example 16, 24, 32, 40 kbits/s.

Similarly, the encoder of FIG. 1 may operate at different sampling frequencies, for example 8, 16, 24, 32 kHz corresponding to bit rates of 8, 16, 24, 32 kbits/s.

Referring to the flowchart of FIGS. 4A and 4B, the processing steps will now be described to be applied to the signal at transmission in the case of a one-bit per sample encoder. These steps correspond, in the case of implementation using wired circuits, to a circuit slightly different from that shown in FIGS. 1 and 2 and include background noise processing which can be dispensed with. The flowchart of FIG. 4 then comprises the steps for gain computation (corresponding to the function of the CG 16 on FIG. 1) and prediction (function fulfilled by the FPAA 14 on FIG. 1).

Processing for attenuation of the background noise

Figure 4A:
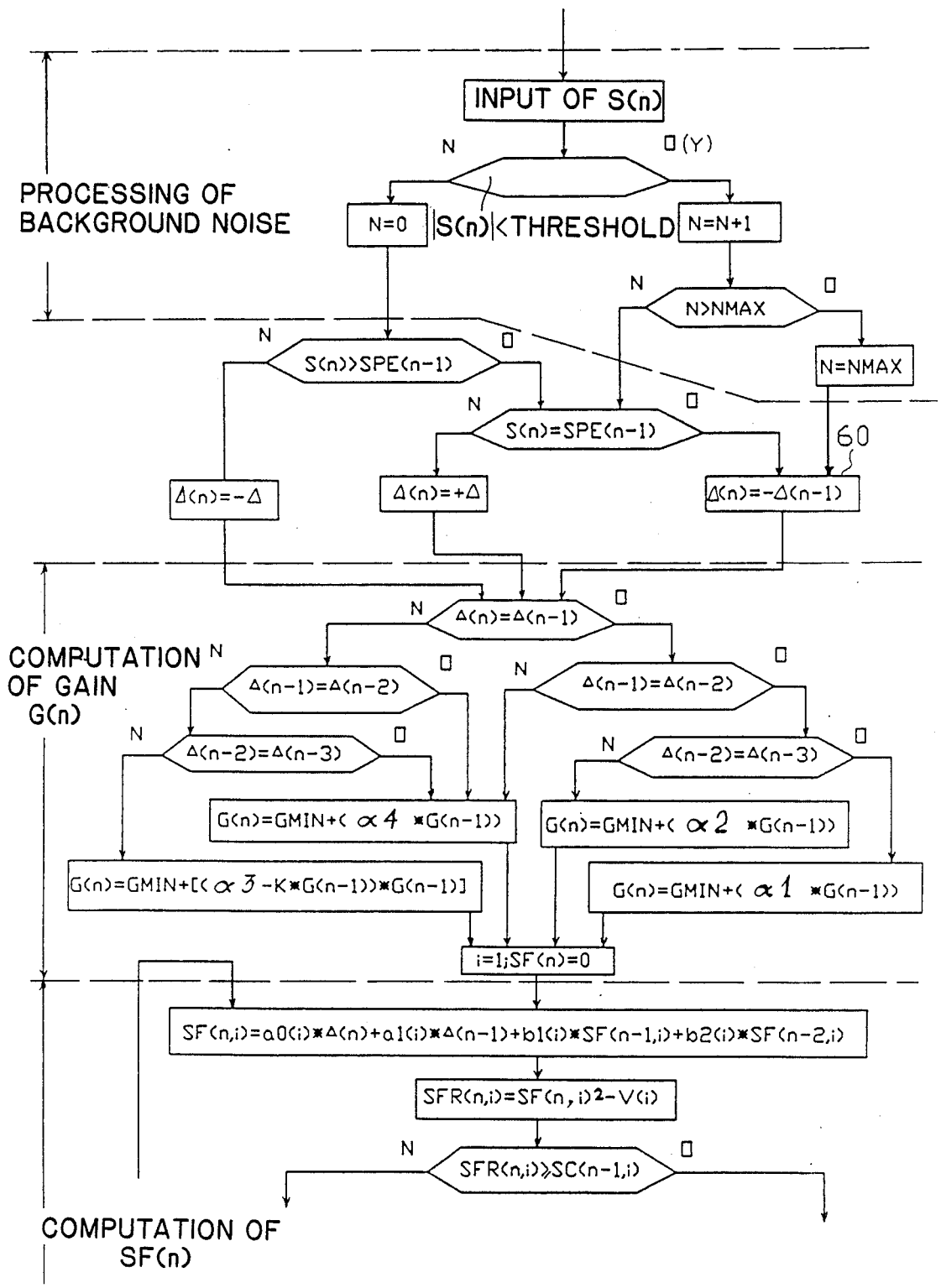
FIGS. 4A and 4B form a logic diagram showing the operations taking place in the encoder of FIG. 1.
Figure 4B:
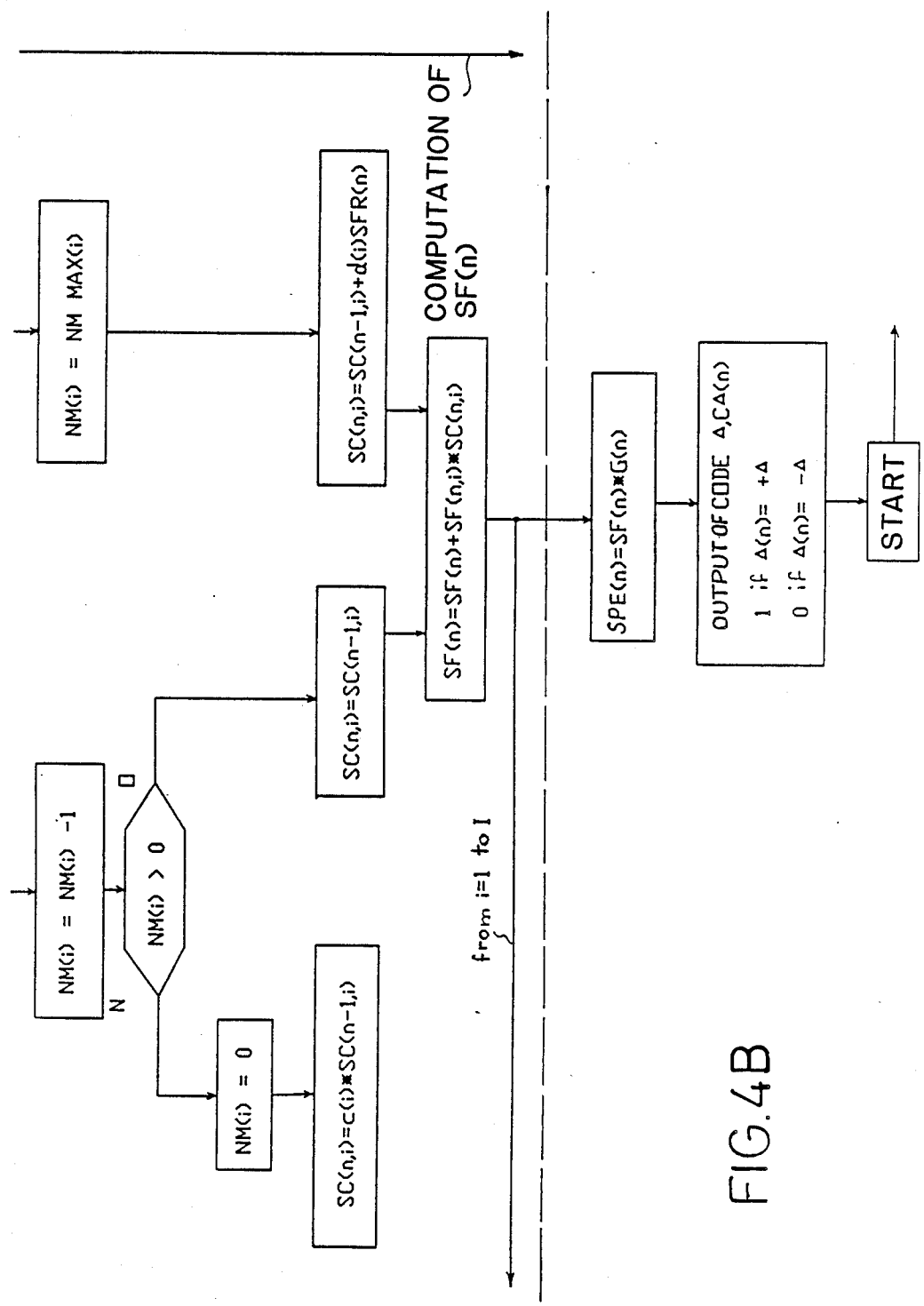

The step for processing the background noise shown in FIGS. 4A and 4B is of advantage for telephony for it makes it possible to reduce the perceptability of the background noise if commercial input encoders are used.

The signal S(n), sampled for example at a frequency of 16 kHz in the case of telephone signals, is subjected to a test comparing its successive absolute values |S(n)| with a reference value and the error signal $\Delta(n)$ is "forced" to different levels depending on the result of the test. As illustrated, the absolute value of each sample in its turn is compared with a fixed THRESHOLD value. In an embodiment which has been effectively implemented, NMAX was chosen equal to 2 and the THRESHOLD value was chosen equal to the second level from the lowest level which S(n) may assume.

If the input level |S(n)| is, more than twice in succession,
  equal to the level of the preceding level, and
  lesser than or equal to THRESHOLD, the signal of $\Delta(n)$ is reversed (block 60) which results in forcing G(n) towards its minimum value by due to operation of the gain computing algorithm.

Processing of the background noise is followed by a comparison between the current value of the signal S(n) and the predicted value SPE(n−1), which results in sending the level $+\Delta$ or $-\Delta$ to the encoder 30.

Computation of transmission gain G(n)

The gain is computed using the above-mentioned strategy, but using more complex operations than simple multiplication for modifying the gain. The predetermined values used during computation and mentioned in FIG. 4A are:
GMIN: which determine the minimum value of the gain,
$\alpha 1$: "high" increase ratio of the gain in the case of the presence of four successive identical error signals $\Delta$,
$\alpha 2$: "slight" increase in gain ratio in the case of the presence of three successive identical error signals $\alpha$,
$\alpha 3$: "high" reduction ratio in the case of the presence of four successive reversals of the error signal $\Delta$,
$\alpha 4$: "slight" reduction ratio of the gain in all other cases.

The role of the high increase or reduction of the gain is immediately apparent. The "slight" increase of the gain when $\Delta$ takes the same value three times in succession permits situations to be processed in which there is not possibility of occurence of more than three successive values equal to $\Delta$. This case may occur for signals which have no marked components below 2.3 kHz, whereas the sampling frequency is 16 kHz. The ratio 60 2, which corresponds to processing in this case, must be sufficiently high to allow clear perception of the sounds having high frequency components, such as hissing or whistling sounds. It must however remain sufficiently low so as to avoid a continual variation of the gain during the stable phases of the speech signal, which variation would make the voice rough when reconstructed.

Good results have been obtained by adopting the following values for the different ratios and coefficients:
$\alpha 1 \approx 1.077$
$\alpha 2 \approx 1.025$
$\alpha 3 \approx 0.973$
$\alpha 4 \approx 0.996$
GMIN$= 2^{-15}$ In the flowchart shown in FIGS. 4A and 4B, the "high" decrease algorithm responsive to four successive reversals of $\Delta$ involves, in the ratio multiplying G(n−1) not only GDIM1 but also a correction term which is a function of G(n−1):

$$G(n) = GMIN + [(\alpha 3 - K^*G(n-1))^*G(n-1)]$$

The role of the coefficient K, which will always be very much less than 1 (for example equal to 0.012) is to make possible fast alignment of the gains on the transmission side and on the reception side, where it also appears, if there is a transmission error.

Computation of the filtered signal at transmission SF(n)

At the beginning of operation, initialization is carried out by resetting SF(n).

The sequence shown in FIG. 4B is repeated for all the successive values of i, from i=1 to i=I.

Figure 2:
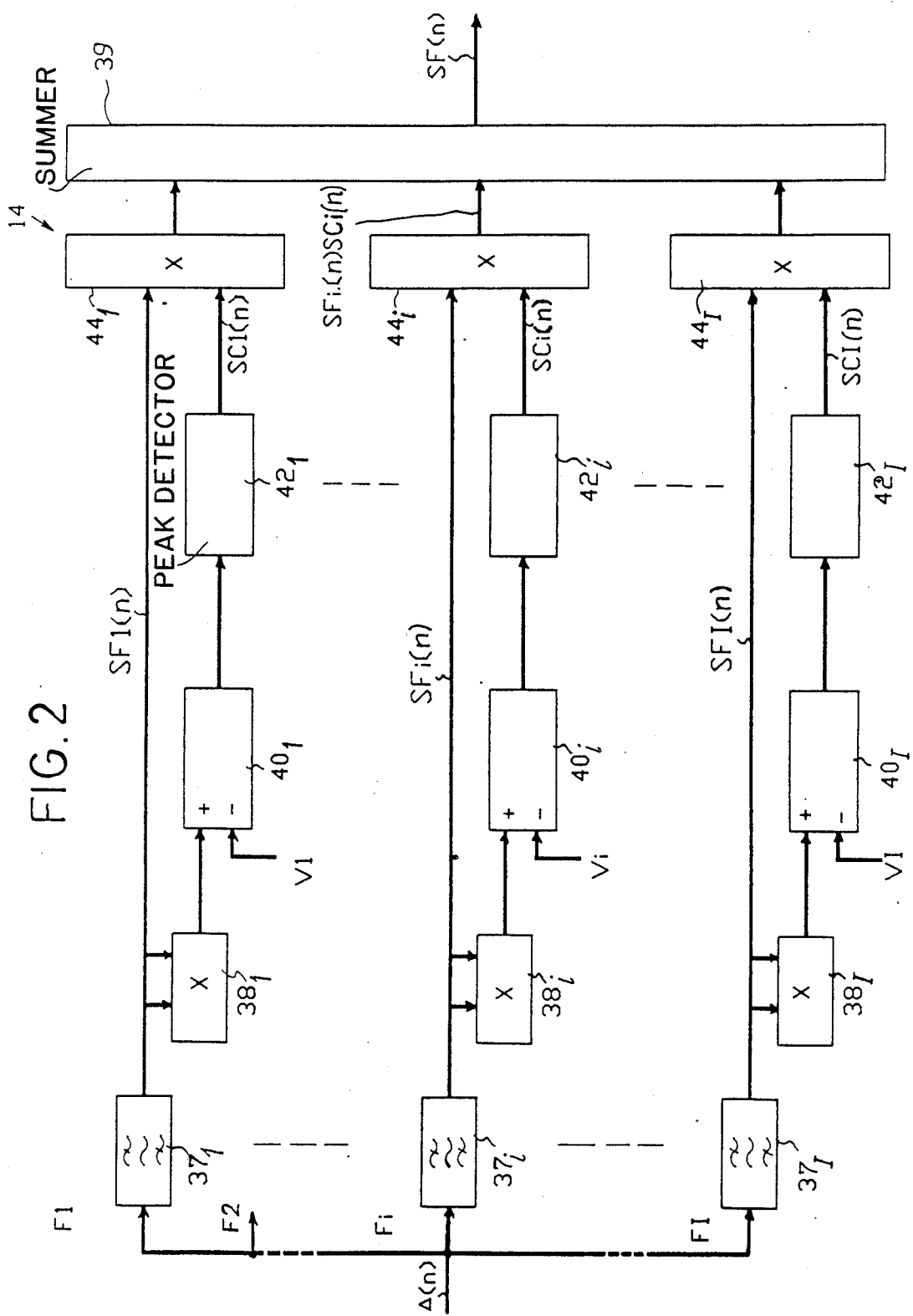
FIG. 2 is a block diagram showing a possible construction of the self-adaptive predictive filter of the encoder of FIG. 1.

The following notations are used in the flowchart of FIG. 4B, in addition to those already shown in FIG. 2:
NM: number of successive holds;
NMAX: maximum predetermined value which is accepted for NM.

The successive steps are those defined for the functional blocks in FIG. 2.

By way of example, it may be mentioned that, in the case where the parameters processed may have any value between $-1$ and $+(1-2^{-15})$, which corresponds to digitization on 16 bits, the values given in the table below may be adopted for the different channels.

TABLE I

| i (No. of filter) | Limits at −3 dB (Hz) | ΔF | V(i) | NMAX | c(i) | d(i) |
|---|---|---|---|---|---|---|
| 1 | 250–600 | 350 | 0,0078 | 160 | 0,996 | 0,00244 |
| 2 | 470–800 | 330 | 0,0156 | 148 | 0,9956 | 0,00293 |
| 3 | 680–1 010 | 330 | 0,031 | 136 | 0,9954 | 0,00317 |
| 4 | 895–1 225 | 330 | 0,051 | 124 | 0,9951 | 0,00342 |
| 5 | 1 115–1 475 | 360 | 0,076 | 112 | 0,9946 | 0,00391 |
| 6 | 1 345–1 780 | 435 | 0,109 | 100 | 0,9941 | 0,00439 |
| 7 | 1 630–2 160 | 530 | 0,164 | 88 | 0,9937 | 0,00488 |
| 8 | 1 985–2 735 | 750 | 0,23 | 76 | 0,9929 | 0,00562 |

TABLE I-continued

| i (No. of filter) | Limits at −3 dB (Hz) | ΔF | V(i) | NMAX | c(i) | d(i) |
|---|---|---|---|---|---|---|
| 9 | 2 525–3 625 | 1 100 | 0,34 | 64 | 0,9922 | 0,00635 |

NMAX is so selected that the peak voltage SC(n) in a given channel can decrease, after it has increased, only after number of samples have passed equal to NMAX for stabilizing the evolution of the voltages SC(n), which has a favorable effect by avoiding roughness of the signal re-constructed at reception.

The values given in Table I are only examples given by way of indication. They correspond to the case where nine channels only are available. To the extent that the increase of computing speed required by an increased number of channels is acceptable, a circuit for computing SF(n) having about fifteen channels seems close to an optimum in telephony. With fifteen channels, the width of the filters corresponding to the high frequencies may be reduced and so the spectral resolution may be improved.

Figure 5:
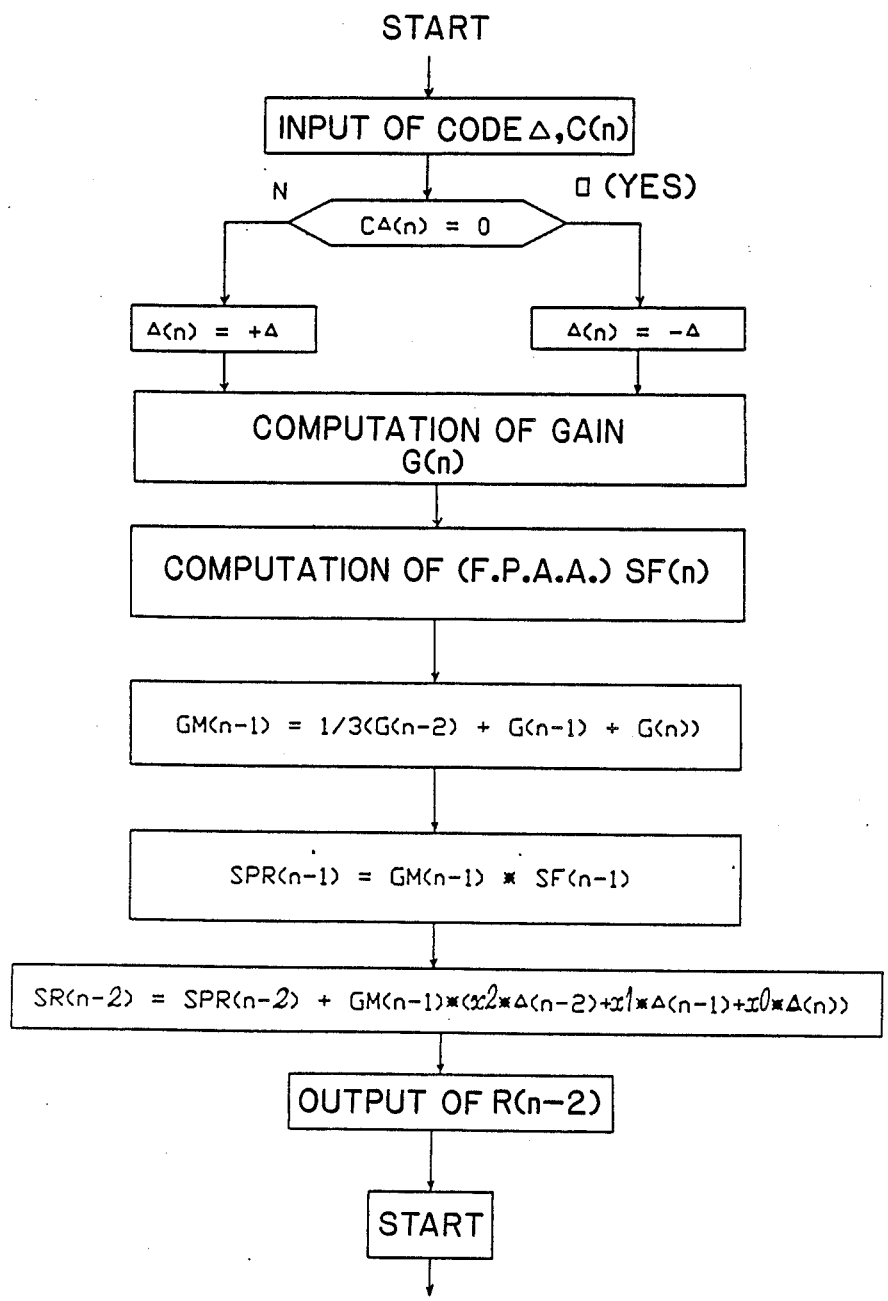
FIG. 5, similar to FIG. 4, shows the operations which take place in the decoder of FIG. 1.

The reception flowchart shown in FIG. 5 does not repeat the detail of calculating the gain G(n) and SFR(n) since they may be identical to those of FIG. 4.

The flowchart shows that the mean of the current gain G(n−1), of the preceding gain G(n−2) and of the following gain G(n) is calculated for each code CΔ so as to smooth the gain in the stationary phases while ensuring that the variation slopes of the gains are held in transitory phases, when the gain changes rapidly. In the latter case, GMIN has two functions:

it limits G(n) to a minimum value when G(n) decreases, it guarantees that G(n) increases when the latter takes on the smallest possible value, considering the accuracy of the computations.

An additional modification is formed by the fact that, to obtain the re-constructed signal SR(n−2), three samples of Δ, respectively Δ(n), Δ(n−1), Δ(n−2) weighted by multiplying coefficients less than 1 by at least two orders of magnitude (instead of two samples in the case of transmission) are added to the predicted signal SPR(n−2).

The values of the three weighting coefficients may for instance be:

x0 = 0.00244
x1 = 0.01074
x2 = 0.01123

The encoder and the decoder described above, in the version with a predictor comprising nine channels in parallel relation, may be implemented using a commercial processor, for example a NEC 77 P20 processor.

A version with 15 or 16 parallel channels can also be implemented with signal processors available at the present time.

I claim:

1. A differential encoder comprising:
   a prediction loop circuit,
   a comparator having an additive input and a subtractive input and generating on an output an error signal and receiving, on said additive input, successive samples of an input signal to be encoded and, on said subtractive input, an estimated signal delivered by said prediction loop circuit which receives the error signal from the output of the comparator, said prediction loop circuit comprising a self-adaptive predictive filter receiving said error signal from the output of said comparator, a gain control circuit, and a multiplier which receives that output of the predictive filter and of the gain control circuit and generates an output which is connected to said subtractive input of said comparator, wherein said self-adaptive predictive filter comprises a plurality of parallel channels assigned to different mutually adjacent spectral bands, and a common summer, each channel comprising an input pass-band filter, a quadratic detector fed by said pass-band filter, a multiplier, and a peak detector whose input is connected to the quadratic detector and whose output is applied to said multiplier which also receives the output signal from the respective pass-band filter, the outputs of the multipliers of each channel connected to and driving said common summer.

2. The differential encoder according to claim 1, wherein the comparator is arranged for delivering a constant level output signal having plus or minus polarity and wherein said encoder further comprises a circuit receiving the output signal from the comparator and transforming said output signal into a binary code which is sent on the line, the output of the encoder having one bit per input sample of the signal to be encoded.

3. The differential encoder according to claim 2, wherein each of said channels further comprises a circuit for subtracting an adjustable value from the output signal of the quadratic detector, said subtracting circuit being located between the quadratic detector and the peak detector.

4. The differential encoder according to claim 3, wherein said adjustable value is different according to the channel and has a magnitude which is higher for the channels having spectral bands of higher frequencies, whereby the predictability is enhanced for the higher frequencies.

5. The differential encoder according to claim 1, connected to receive a speech signal to be encoded, wherein the pass-band filters have band widths which are higher for the higher frequencies or have a constant width and wherein the number of channels is comprised between 8 and 16.

6. The differential encoder according to claim 1, wherein the peak detector is constructed to operate according to the algorithm:

if $SCi_n < ((SFi_{(n)})^2 - Vi)$, then $SCi_n$ is adjusted at the level $SCi_{(n-1)} + di((SFi_{(n)})^2 - Vi)$;

if $SCi_{(n)} \geq ((SFi_{(n)})^2 - Vi)$ for more than Mi successive samples, then $SCi_{(n)}$ is adjusted at level ci.($SCi_{(n-1)}$);

if $SCi_{(n)} \geq ((SFi_{(n)})^2 - Vi)$ for less than Mi successive samples, then $SCi_{(n)}$ is kept at level $SCi_{(n-1)}$;

wherein $SCi_{(n)}$ designates the output of the peak detector, the terms on the right side of the above-identified equations designating the signal applied to the input of the peak detector, Mi designates a predetermined number higher than 1 and ci and di designate coefficients smaller than 1, $SFi_{(n)}$ designates the frequency response law for the pass-band filter of the ith channel, and Vi a constant value depending on the rank of the pass-band filter of the ith channel.

7. The differential encoder according to claim 1, wherein the gain control circuit is contructed to operate according to an adaptation algorithm responsive to a sequence of values Δ(n) successively present at the input thereof, where n designates the present value $S_{(n)}$ at said input, said algorithm being represented by the following criteria:

if four identical values appear at the output of the comparator as indicated by the expression:

$$\Delta(n)=\Delta(n-1)=\Delta(n-2)=\Delta(n-3),$$

the transmission gain $G_{(n)}$ of the gain control circuit is increased, by multiplying it by a factor $\alpha 1$ greater than 1;

if there are only three identical values which follow each other as indicated by the expression:

$$\Delta(n)=\Delta(n-1)=\Delta(n-2)=\Delta(n-3),$$

the gain $G_{(n)}$ is increased, by multiplying it by a factor $\alpha 2$ greater than 1 but less than $\alpha 1$:

if three successive alternations occur as indicated by the expression:

$$\Delta(n)=\Delta(n-1)=\Delta(n-2)=\Delta(n-3),$$

the gain $G_{(n)}$ is decreased, by multiplying it by a coefficient $\alpha 3$ lesser than 1;

in all other cases, $G_{(n)}$ is decreased, by multiplying it by a coefficient $\alpha 4$, with $\alpha 3 < \alpha 4 < 1$.

8. The differential encoder according to claim 7, wherein, responsive to said three successive alternations, the gain of said gain control circuit is decreased by multiplying it by a coefficient $\alpha 3 - k.G(n-1)$ where k is a constant value.

9. A differential encoder-decoder system comprising an encoder for generating an encoded signal and a decoder for decoding said encoded signal said differential encoder comprising:

a prediction loop circuit, a comparator having an additive input and a subtractive input and generating on an output an error signal and receiving, on said additive input, successive samples of an input signal to be encoded and, on said subtractive input, an estimated signal delivered by said prediction loop circuit which receives the error signal from the output of the comparator, said prediction loop circuit comprising a self-adaptive predictive filter receiving said error signal from the output of said comparator, a gain control circuit, and a multiplier which receives the output of the predictive filter and of the gain control circuit and generates an output which is connected to said substractive input of said comparator, wherein said self-adaptive predictive filter comprises a plurality of parallel channels assigned to different mutually adjacent spectral bands, and a common summer, each channel comprising an input pass-band filter, a quadratic detector fed by said pass-band filter, a multiplier, and a peak detector whose input is connected to the quadratic detector and whose output is applied to said multiplier which also receives the output signal from the respective pass-band filter, the outputs of the multipliers of each channel connected to and driving said common summer, said decoder comprising a predictor filter identical to the predictor circuit of the encoder for receiving said encoded signal, a delay circuit, a computing unit for computing the reception gain and a multiplier connected to receive the reception gain delivered by said computing unit on one input and the filtered signal from the output of the predictor filter on another input through said delay circuit having a transmit time equal to the time interval between two successive samples of the encoded signal received by said predictor of said decoder.

10. The differential encoder-decoder system according to claim 9, wherein the multiplier of said decoder is arranged for providing a mean reception gain equal to $$GM(n-1)=\alpha 7.G(n-2)+\alpha 6.G(n-1)+\alpha 5.G(n)$$

where $GM(n-1)$ designates a mean reception gain for the value $S(n-1)$ of said input signal to be encoded and $G(n-2)$, $G(n-1)$ designate the transmission gain for corresponding values $S(n-2)$ and $S(n-1)$ respectively, of said input signal to be encoded, with $\alpha 5 + \alpha 6 + \alpha 7 = 1$.

11. The differential encoder-decoder system according to claim 10, wherein said decoder further comprises an output adder which receives a predictive reception signal delivered by the multiplier and three values which respectively represent:

the value of $\Delta(n)$ weighted by multiplication by a fixed coefficient $\alpha 0$ and multiplied by the reception gain $GM(n-1)$ delivered by said computing unit;

the value of $\Delta(n-1)$ weighted by multiplication by a fixed coefficient $\alpha 1$ and multiplied by the gain $GM(n-1)$, the value of $\Delta(n-2)$ weighted by multiplication by a fixed coefficient $\alpha 2$ and multiplied by the gain $GM(n-1)$.

* * * * *